United States Patent [19]
Naka et al.

[11] Patent Number: 6,085,158
[45] Date of Patent: *Jul. 4, 2000

[54] UPDATING INTERNAL STATES OF A SPEECH DECODER AFTER ERRORS HAVE OCCURRED

[75] Inventors: Nobuhiko Naka, Yokohama; Tomoyuki Ohya, Yokosuka, both of Japan

[73] Assignee: NTT Mobile Communications Network Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/776,171
[22] PCT Filed: May 20, 1996
[86] PCT No.: PCT/JP96/01323
§ 371 Date: Jan. 22, 1997
§ 102(e) Date: Jan. 22, 1997
[87] PCT Pub. No.: WO96/37964
PCT Pub. Date: Nov. 28, 1996

[30] Foreign Application Priority Data

May 22, 1995 [JP] Japan ................................. 7-122585

[51] Int. Cl.[7] ........................................................ G10L 3/02
[52] U.S. Cl. .......................................... 704/228; 704/501
[58] Field of Search .................................. 704/226, 227, 704/228, 500, 501

[56] References Cited

U.S. PATENT DOCUMENTS

| | | | |
|---|---|---|---|
| 4,430,736 | 2/1984 | Scholz | 371/31 |
| 5,305,332 | 4/1994 | Ozawa | 371/31 |
| 5,392,129 | 2/1995 | Ohtaka et al. | 386/48 |
| 5,432,884 | 7/1995 | Kapanen et al. | 704/228 |
| 5,574,825 | 11/1996 | Chen et al. | 704/228 |
| 5,596,678 | 1/1997 | Wigren et al. | 704/228 |
| 5,615,298 | 3/1997 | Chen | 704/228 |
| 5,862,518 | 1/1999 | Nomura et al. | 704/214 |

FOREIGN PATENT DOCUMENTS

| | | |
|---|---|---|
| 5-175940 | 7/1993 | Japan . |
| 5-199124 | 8/1993 | Japan . |

*Primary Examiner*—David R. Hudspeth
*Assistant Examiner*—Harold Zintel
*Attorney, Agent, or Firm*—Brinks Hofer Gilson & Lione

[57] ABSTRACT

When errors occur in a received code sequence, an error concealment routine part 130 is actuated and a correct code sequence is generated based on a code sequence received before the errors are detected. A decoding routine part 21' executes a decoding process based on this code sequence and updates the internal state based on the decoded result. Thereafter, when the code errors are recovered, an error recovery routine part 140 is actuated. The error recovery routine part 140 re-estimates a correct code sequence during a time period when the errors are detected, based on a code sequence received before the errors are detected and a code sequence received after no more errors are detected, and generates a second estimated code sequence. The decode process part 21' executes the decoding process based on an internal state information for retaining the second estimated code sequence in an internal state storage part 23', and updates the internal state information based on the decoded result. By doing this, the quality of the decoded speech, which has recovered from code errors, can be improved.

20 Claims, 6 Drawing Sheets

UPDATING INTERNAL STATES OF A SPEECH DECODER AFTER ERRORS HAVE OCCURRED

BACKGROUND OF THE INVENTION

1. Technical Field

This invention relates to a speech decoder suite to be used for digital speech communication.

2. Background Art

Figure 6:
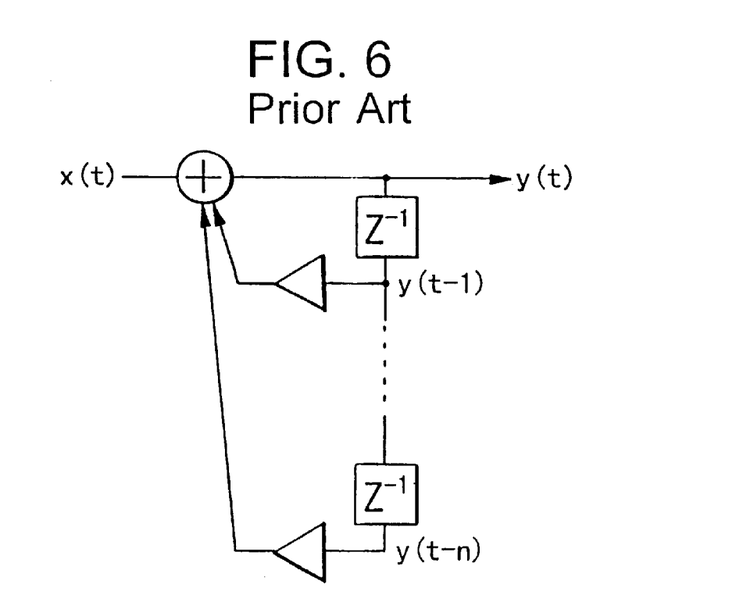
FIG. 6 is a view exemplifying an IIR filter for explaining the internal states.

In a low bit rate speech coding algorithm, a coding algorithm, which is based on a CELP (Code Excited Linear Prediction Coding) such as LD-GELP (ITU-T/G. 728), VSELP and SPI-CELP (RCR/STD27-C) is widely used. Although it is not limited to such a CELP series speech coding algorithm, in order to carry out a coding correctly in a coding algorithm having internal states in an encoder and in a decoder, it is essential that the internal state of the encoder is exactly coincident with that of the decoder. Here, imagining, for example, an IIR filter of FIG. 6, the terms "internal state" corresponds to y(t−1), . . . , y(t−1) of the output signal sequences till last time. In other words, when a decoding is currently carried out utilizing a decoded result in the past as in the speech coding algorithm, the decoded result in the past corresponds to the above-mentioned "internal state". An adaptive codebook is its representative example.

However, the decoder sometimes carries out a decoding with damaged codes due to code errors which occur on a transmission line. In that case, it occurs that the internal state of the encoder is not coincident with that of the decoder. When such a non-coincidence of the internal states occurs, a decoding cannot be carried out in a correct manner even if a correct code is used, and distortion of the decoded speech continues for a while even after the recovery of the code errors. Thus, a large degradation of quality results.

Figure 7:
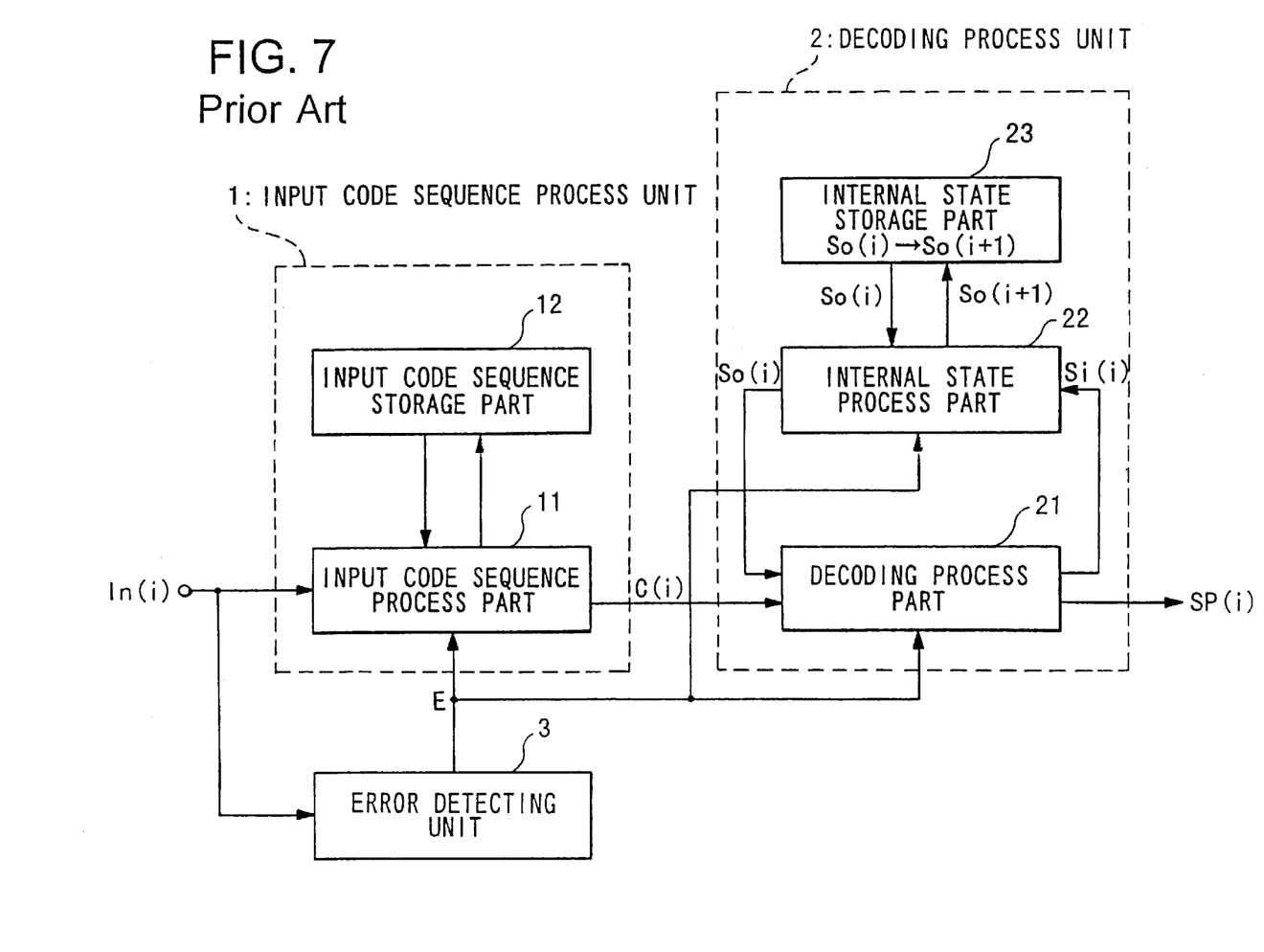
FIG. 7 is a block diagram showing a component configuration of a conventional speech decoder.

A speech decoder is known as a device capable of lessening the degradation of quality, which is employed in a PDC (Personal Digital Cellular telecommunication system) full rate algorithm as shown in FIG. 7. In FIG. 7, reference numeral 1 denotes an input code sequence process unit which comprises an input code sequence process part 11 and input code sequence storage part 12. Reference numeral 2 denotes a decoding process unit which comprises a decoding process part 21, an internal state process part 22, and an internal state storage part 23. Reference numeral 3 denotes an error detection unit for detecting the errors of a received input code sequence In(i) (where i represents time and takes a value of i=0, 1, 2, . . . ) utilizing a CRC (Cyclic Redundancy Code).

The error detection unit 3 outputs an error detection signal E to the input code sequence process part 11 and the decoding process part 21 when it detects errors in the input code sequence In(i).

The input code sequence process part 11 removes redundancy bits from the input code sequence In(i) and outputs the same in the form of a code sequence C(i) to the decoding process part 21 when no errors are detected in the input code sequence In(i) and no error detection signal (E) is output from the error detection unit 3. This code sequence C(i) is also output to the code sequence storage part 12 and stored therein.

Based on internal state information So(i) supplied from the internal state process part 22, the decoding process part 21 decodes the code sequence C(i), outputs a decoded speech SP(i), and outputs the internal state information Si(i) to the internal state process part 22 at the time point when the decoding process is finished. The internal state process part 22 reads the internal state information So(i) stored in the internal state storage part 23, outputs the same to the decoding process part 21, prepares internal state information So(i+1) after the completion of the routine in the decoding process part 21, based on the internal state information Si(i) supplied from the decoding process part 213 and stores the internal state information So(i+1) in the internal state storage part 23. By doing this, the contents stored in the internal state storage part 23 are updated to So(i+1) from So(i) when the decoding process is finished at time i.

It is supposed that errors are found in the input code sequence In(t) at time t and the detection signal E is output from the error detection unit 3. The input code sequence process part 11 replaces a code A by a code B, the code A corresponding to an LSP (Line Spectrum Pair, i.e., parameter of a synthesis or inverse filter showing a spectrum envelope of the speech) and an LAG (i.e., delay quantity of the adaptive codebook showing the pitch cycle of the speech) contained in the code sequence C(t) from which the redundancy bits are already removed, the code B corresponding to the code sequence C(t−1) stored in the input code sequence storage part 12. The input code sequence process part 11 outputs a code sequence C'(t) after the replacement. The contents of the input code sequence storage part 12 at that time remain the same as code sequence C(t−1) and are not updated. The decoding process part 21 carries out the above decoding process and updates the internal state utilizing the code sequence C'(t) supplied from the input code sequence process part 11.

The LSP and LAG as objects for replacement have a high correlation with respect to time and are not abruptly changed with the passage of time. Accordingly, the values of the adjacent LSP and LAG computed for each predetermined section are close to each other. Consequently, the distortion of the decoded speech SP(t) is lessened when the decoding process is carried out based on the correctly received code immediately before the detection of errors rather than when the decoding process is carried out based on the code containing errors. As a consequence, the degradation of quality can be reduced at the time point when the errors occur.

However, when the LSP and LAG are replaced in a conventional manner, it is seldom that the code sequence C'(t) after the replacement is coincident with the code sequence C(t) which is presumed to contain no errors. Accordingly, an occurrence of code errors makes it even more difficult for the internal state information So(i+1) stored in the internal state storage unit 23 to coincide with the internal state of the encoder. Accordingly, even in the event that no errors are detected from, for example, time t+s onward and a correct code sequence C(t+s) can be obtained, the decoded speech SP(t+s) tends to be degraded due to non-coincidence of the internal states. Especially, since the correlation between the LSP and LAG is reduced as the time s during which the code errors occur is increased, the degree of non-coincidence of the internal states is further increased and the degradation of the decoded speech SP(t+s) is increased, too.

DISCLOSURE OF INVENTION

The present invention has been accomplished under the above-mentioned background. It is, therefore, an object of the present invention to provide a speech decoder capable of improving the quality of decoded speech after the recovery from code errors.

According to the present invention, a speech decoder basically comprises error detection means for detecting whether or not a code sequence obtained by receiving a code sequence of a speech signal transmitted in the form of compressed digital data through a predetermined coding algorithm contains code errors, first estimation means for estimating, when errors are detected in the received code sequence by the error detection means, a correct code sequence based on a code sequence received before code errors were detected by the error detection means and outputting an estimated code sequence, decoding means for decoding the estimated code sequence based on internal state information retained therein and transforming the same into a speech signal, and updating means for updating the internal state information based on the decoded result achieved by the decoding means. The speech decoder is characterized by further comprising second estimation means for re-estimating a correct code sequence during a time period when errors are detected based on a code sequence received after no more errors are detected and outputting an estimated code sequence, when errors are detected in the received code sequence by the error detection means but no more errors are detected thereafter, the internal state information being updated based on the decoded result achieved by decoding the estimated code sequence output by the second estimation means. In this case, the second estimation means re-estimates a correct code sequence during the time period when errors are detected, based oh the code sequence received after no more errors are detected, and outputs an estimated code sequence. The decoding means decodes this estimated code sequence, and the updating means updates the internal state information based on this decoded result. Accordingly, the enlarged discrepancy of the internal state information between the encoder and the decoder during the time when the code errors occur, is compensated.

Here, the second estimation means may re-estimate a correct code sequence during the time period when errors are detected based on a code sequence received before errors are detected and a code sequence received after no more errors are detected and output an estimated code sequence, when errors are detected in the received code sequence by the detection means but no more errors are detected after the passage of the predetermined time.

The second estimation means may re-estimate a correct code sequence during a time period when errors are detected based on a code sequence received immediately after no more errors are detected among all code sequences received after no more errors are detected, and output an estimated code sequence. Furthermore, the second estimation means may re-estimate a correct code sequence during a time period when errors are detected based on code sequences received after no more errors are detected, and output an estimated code sequence.

In the speech decoder, the second estimation means may estimate a correct code sequence based on a code sequence received immediately before the detection of the errors among all code sequences received before the errors are detected. In that case, the first estimation means may estimate a correct code sequence based on a code sequence received immediately before the detection of the errors among all code sequences received before the errors are detected, as in the case with the second estimation means.

In the speech decoder, the second estimation means may estimate a correct code sequence based on code sequences received before the detection of the errors. In that case, the first estimation means may estimate a correct code sequence based on a code sequence received immediately before the detection of the errors among all code sequences received before the errors are detected, as in the case with the second estimation means. Since those speech decoders can estimate the code sequence with a high degree of accuracy, the quality of decoded speech during the time when code errors occur and after the recovery from the code errors can be more improved.

The speech decoder may further comprise switch means for cutting off an external output of a speech signal during the time when the estimated code sequence output by the second estimation means is decoded. In that case, a decoded speech generated during the time when the internal state information is updated can be avoided from being output outside as a delay component. Accordingly, the quality of the decoded speech recovered from the code errors can be even more increased.

The internal state information may be an adaptive codebook.

BEST MODE FOR CARRYING OUT THE INVENTION

One embodiment of the present invention will now be described with reference to the accompanying drawings.

1. Construction of the Embodiment

Figure 1:
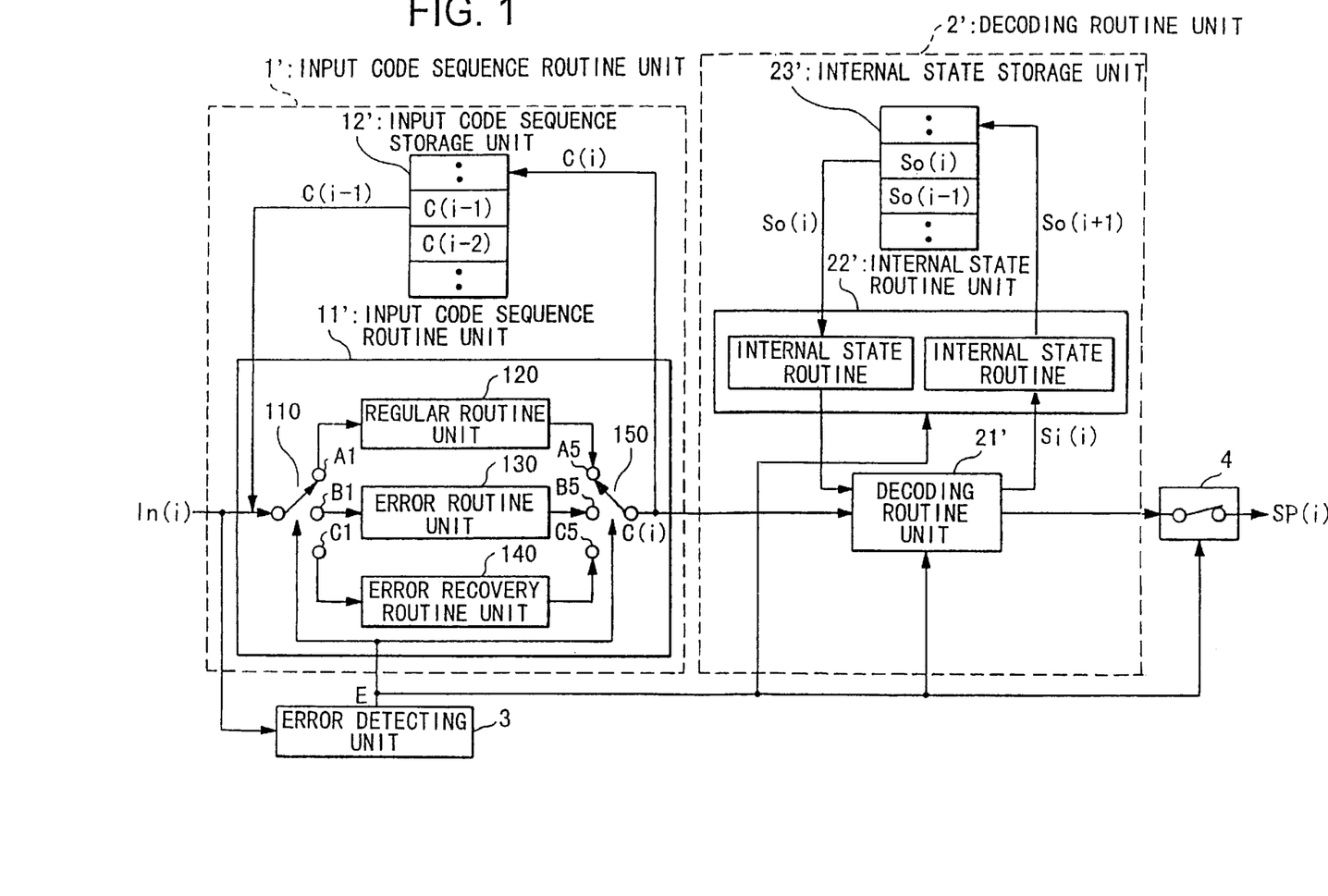
FIG. 1 is a block diagram showing a construction of a speech decoder according to one embodiment of the present invention.

FIG. 1 is a block diagram showing a construction of a speech decoder according to one embodiment of the present invention. In FIG. 1, an input code sequence process unit 1' comprises an input code sequence process part 11' and an input code sequence storage part 12', whereas a decoding process unit 2' comprises a decoding process part 21', an internal state process part 22', and an internal state storage part 23'. The input code sequence process part 11' comprises selector circuits 110, 150 for selectively switching an operating action, a regular routine part 120 for carrying out a regular routine, an error concealment routine part 130 for carrying out a routine when errors occur, and an error recovery routine part 140 for recovering errors. Reference numeral 3 denotes a detecting unit and 4, a switch, respectively.

Figure 3:
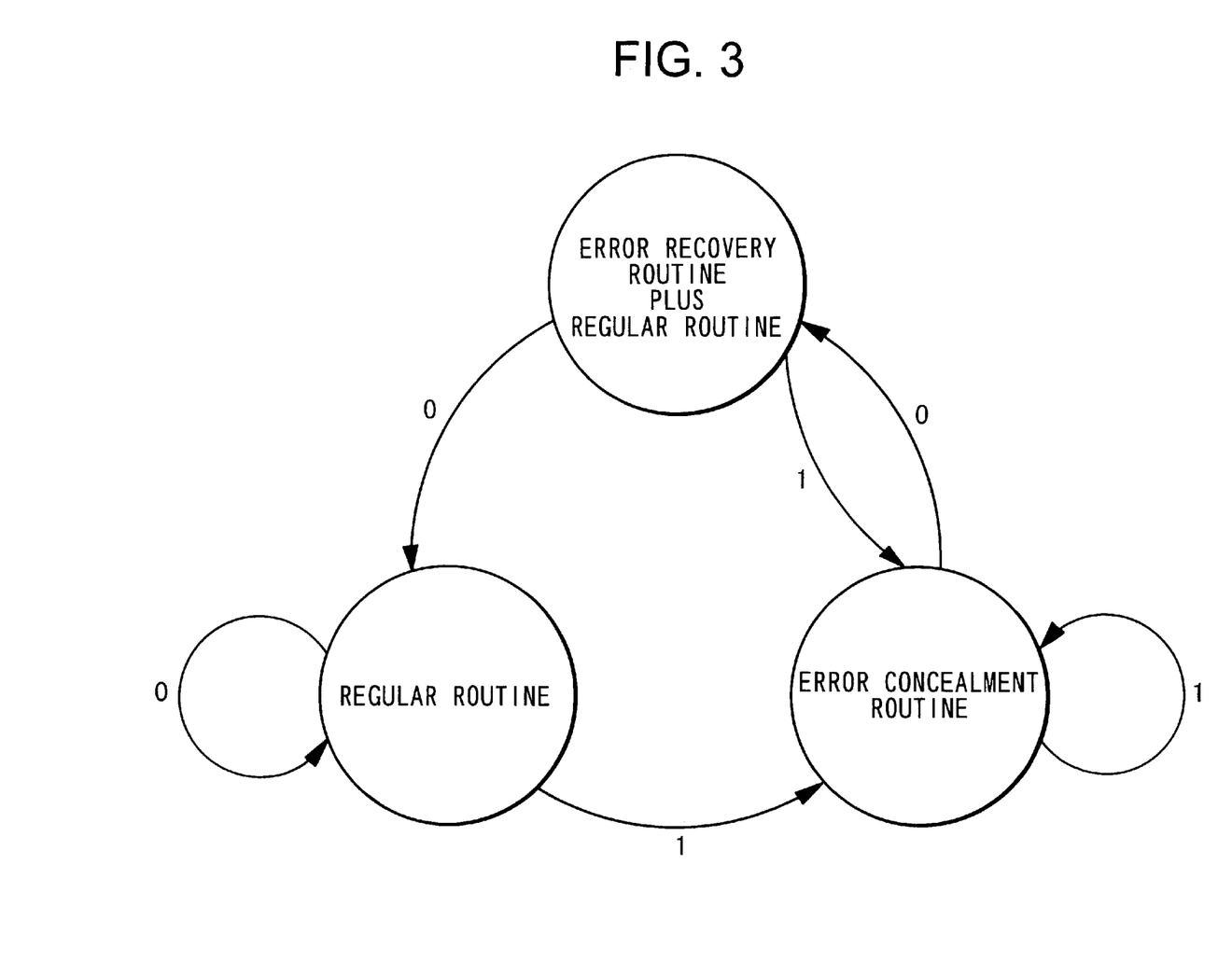
FIG. 3 is a view showing the transition of routine operation in the speech decoder of FIG. 1.

The error detection unit 3 has the same construction as that of FIG. 3. This error detection unit 3 detects errors contained in an input code sequence In(i) transmitted through a transmission line, not shown, generates a detection signal E which becomes "1" when errors are detected in the input code sequence In(i) and it becomes "0" when no errors are detected, and outputs this error detection signal E to the input code sequence process part 11' and the decoding process part 21'.

2. Operation of the Embodiment

2-1: Overall Operation of the Embodiment

An overall operation of the embodiment thus constructed will be described.

Figure 2:
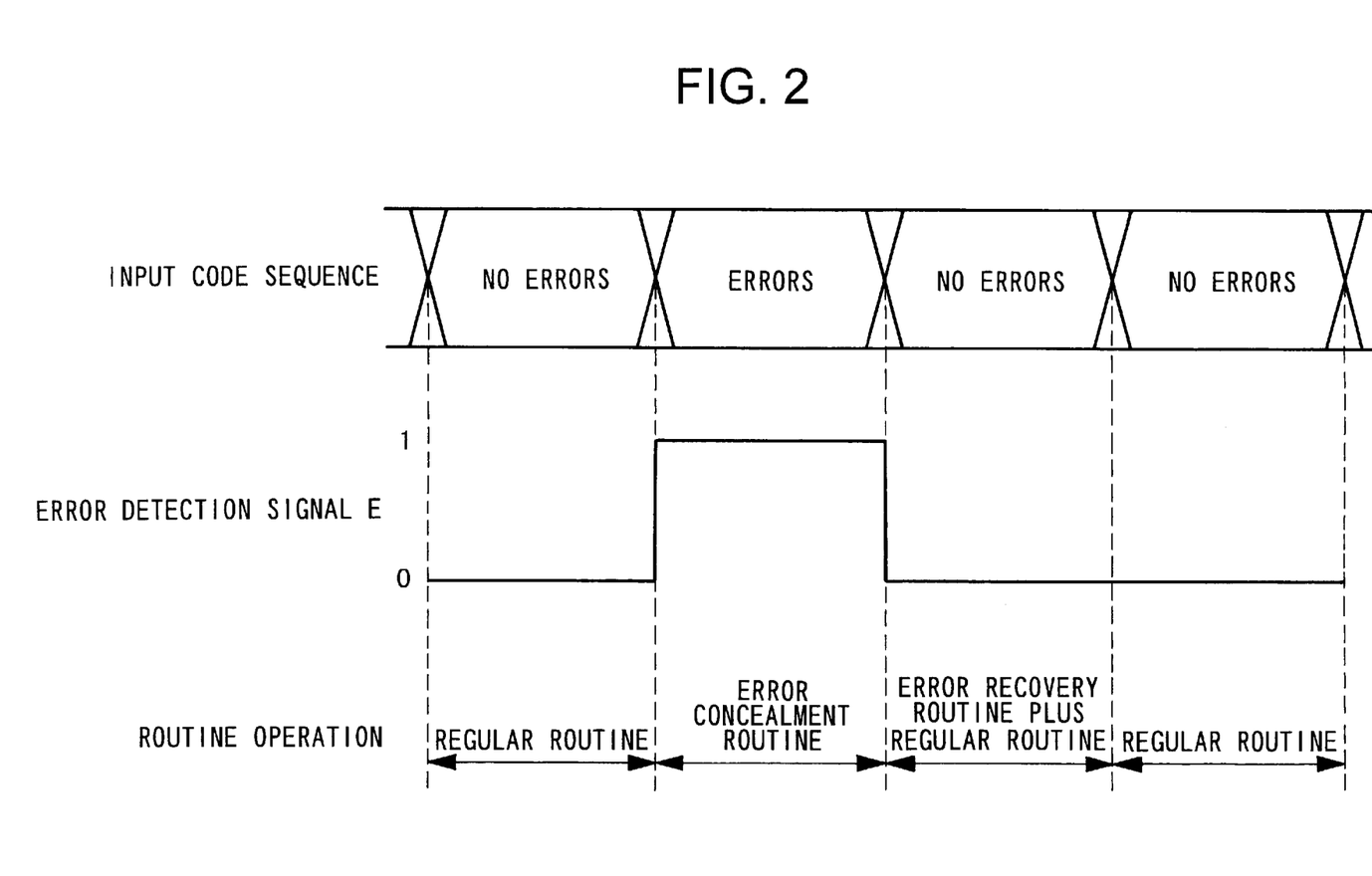
FIG. 2 is a view showing a relation between errors contained in an input code sequence and modes of routine operations of a speech decoder of FIG. 1.

The operation of this embodiment includes a regular routine, an error concealment routine and an error recovery routine. These routines are selected depending on the state of an error occurrable in the input code sequence. First, this will be described with reference to FIG. 2. Now, as shown in FIG. 2, when the input code sequence is changed as "no errors→errors→no errors→errors", the error detection signal E is changed as "0→1→0 →0". In that case, the routine operation is carried out as "regular routine→error concealment routine→error recovery routine and regular routine o regular routine" in this order. FIG. 3 shows the transition of routine operation. In FIG. 3, the error recovery routine and the regular routine are carried out after the error concealment routine is finished and when the error detection signal E shows "0". That is, this operation is carried out only when the state of the input code sequence is changed from "errors" to "no errors". Presuming that the input code sequence contains no errors during the time period from time 0 to time t, errors during the time period from time t+1 to time t+s+1, and no errors during the time period from time t+s onward, the above routine operation will be specifically described with reference to FIGS. 1 and 4.

2-2: Regular Routine

The regular routine is described first. The error detection signal E designates "0" during the time period from time 0 to time t. In that case, the regular routine is carried out at time t=1 and no errors are detected at time t. Therefore, according to the above-mentioned state transition (see FIG. 3), the process proceeds from the regular routine again to the regular routine via the line of "0".

In FIG. 1, when an input code sequence In(t) is supplied to the input code sequence unit 11', the selector circuit 110 selects a terminal A1 and supplies the input code sequence In(t) to the regular routine part 120. Thereafter, when the regular process part 120 removes the redundancy bits from the input code sequence In(t) and supplies the same in the form of a code sequence C(t) to the selector circuit 150, the selector circuit 150 selects a terminal A5 and outputs the code sequence C(t) to the decoding process part 21'. This code sequence C(t) is also output to the input code sequence storage unit 12' and stored thereon (namely, the contents of storage are not updated but the code sequence C(t) is added thereto).

The decoding process part 21' decodes the code sequence C(t) based on the internal state information So(t) supplied from the internal state process part 22'. At that time, the switch 4 is in its ON-state and the decoded speech SP(t) is output to the following step. The decoding process part 21' also outputs the internal state information Si(t) to the internal state process part 22' at the time point when the decoding routine is finished. The internal state process part 22' reads the internal state information So(t) stored in the internal state storage part 23' and outputs the same to the decoding process part 21'. After the process in the decoding process part 21' is finished, the internal state process part 22' generates internal state information So(t+1) based on the internal state information Si(t) supplied from the unit 21' and newly stores the same into the internal state storage unit 23'. When the decoding process is finished at time t by this, the internal state information read from the internal state storage unit 23' is changed from So(t) to So(t+1).

2-3: Error Concealment Routine

The error concealment routine will now be described. In this example, the error detection signal designates "1", during the time period from time t+1 to time t+s+1. In this case, since no errors occur at time t but errors occurs at time t+1, the error detection signal E designates "1". For this reason, according to the above-mentioned state transition (see FIG. 3), the process proceeds from the regular routine to the error routine via the line of "1" at the time point of time t+1.

When the input code sequence In(t+1) is supplied to the input code sequence unit 11' at time t+1, the selector circuit 110 selects a terminal B1. At that time, the code sequence C(t) is read from the input code storage part 12', and supplied to the error concealment routine part 130 via the selector circuit 110. Thereafter, the error concealment routine part 130 calculates an estimated code sequence C'(t+1) based on the code sequence C(t) and outputs the same. The estimated code sequence C'(i) refers to a code sequence which can be obtained by replacing the corresponding part of C(i) by a code having time-wise a large correlation such as the afore-mentioned LSP and LAG among the code sequence C(i−1) before errors occur, for example.

Figure 4:
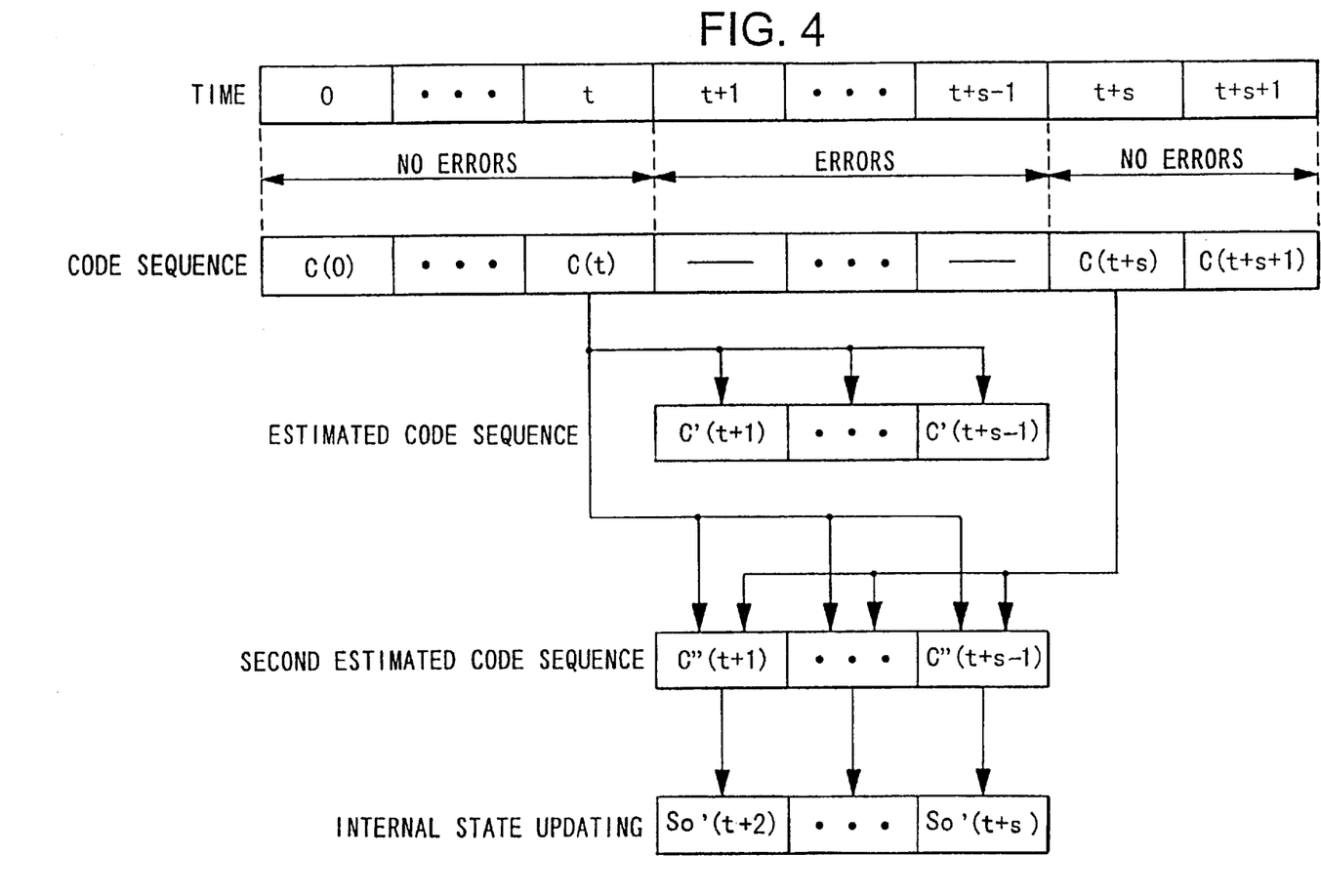
FIG. 4 is a view showing specific an example of the routine operation in the speech decoder of FIG. 1.

Then, the selector circuit 150 selects a terminal B5 and outputs the estimated code sequence C'(t+1) from the error routine part 130 to the decoding process part 21'. By doing this, the decoding process part 21' carries out the above-mentioned decoding and addition of the internal state utilizing the estimated code sequence C'(t+1) supplied from the input code sequence part 11'. During the time period from time t+2 to time t+s−1 following time t+2, the decoding process part 21' also generates an estimated code sequence C'(t+2), . . . C'(t+s−1) based on the code sequence C(t) as shown in FIG. 4 and carries out the decoding process and addition of the internal state based on them.

The reason why the estimated code sequence C'(t+1) is utilized for the error concealment routine as mentioned is that distortion of the decoded speech can be reduced in view of the acoustic sense when the decoding routine is carried out based on the code sequence estimated from the correct code sequence before errors occur rather than when the decoding routine is carried out based on the code in which errors already occur, because the speech has a time-wise correlation.

2-4: Error Recovery Routine

The error recovery routine will now be described. Since no more errors occur from time t+s onward, the error detection signal E at time t+s designates "0". In that case, according to the above-mentioned state transition (see FIG. 3), the process proceeds from the error routine to the error recovery routine and the regular routine via the line of "0".

At time t+s, the switch 4 is brought into its OFF-state. At that time, in the input code sequence process part 11', the selector circuits, 110, 150 select the terminals C1, C5, respectively, to actuate the error recovery routine part 140. As shown in FIG. 4, the error recovery routine part 140 recalculates the code sequence C"(t), . . . , C"(t+s−1) in the error section, and outputs the result as an estimated code sequence. In this case, the error recovery routine part 140 uses the correct code sequence C(t) before errors occur, which code sequence C(t) is a part of the contents of storage in the input code sequence storage unit 12' and the a new correct code sequence C(t+s) generated from the input code sequence In(t+s).

In the decoding process unit 2', the decoding process part 21' carries out a decoding process based on the internal state information So(t) stored in the internal state storage unit 23', and the second estimated code sequence C"(t) The internal state process part 22' prepares an So'(t+1) in accordance with the internal state information Si'(t) based on the result of decoding. The internal state information So(t+1) of the internal state storage part 23' is changed to So'(t+1) (namely, re-updating). However, since the switch 4 is in its OFF-state at that time, no decoded speech is output and only the internal state is updated. Then, the same updating process as mentioned above are carried out based on the newly restored internal state information So'(t+1) and the code sequence C"(t+1). Such process is repeated up to the code sequence C"(t+s−1). As a consequence, the internal state information of the internal state storage part 23' is updated to So'(t+1) . . . So'(t+s−1), as shown in FIG. 4.

When the internal state information is updated again up to So'(t+s), the switch 4 is turned on and the above-mentioned regular routine is started based on the internal state information So'(t+s) and the code sequence (t+s). That is, at time t+s, presuming that the decoding process is carried at time t ., t+s−1 based on the code sequence C"(t), . . . , C"(t+s−1) and the contents of the internal state storage part 23' are added, the decoding process and the addition of the internal state storage unit 23' at time t+s are carried out.

In this way, according to this embodiment, at the time point of time t+s when no more errors are detected, the contents of the internal state storage part 23' at time t+1, . . . t+s−1 when errors occur, are updated again utilizing the code sequence C"(t+1), . . . , C"(t+s−1). By doing this, the content of the internal state storage part 23' can be brought closer to that of the internal state storage part (not shown) on the encoder side. As a consequence, distortion at time t+s onward can be reduced. Moreover, since the switch 4 is turned off at time t+s, no delay component of the decoded speech is output.

3. Experimental Example

Figure 5:
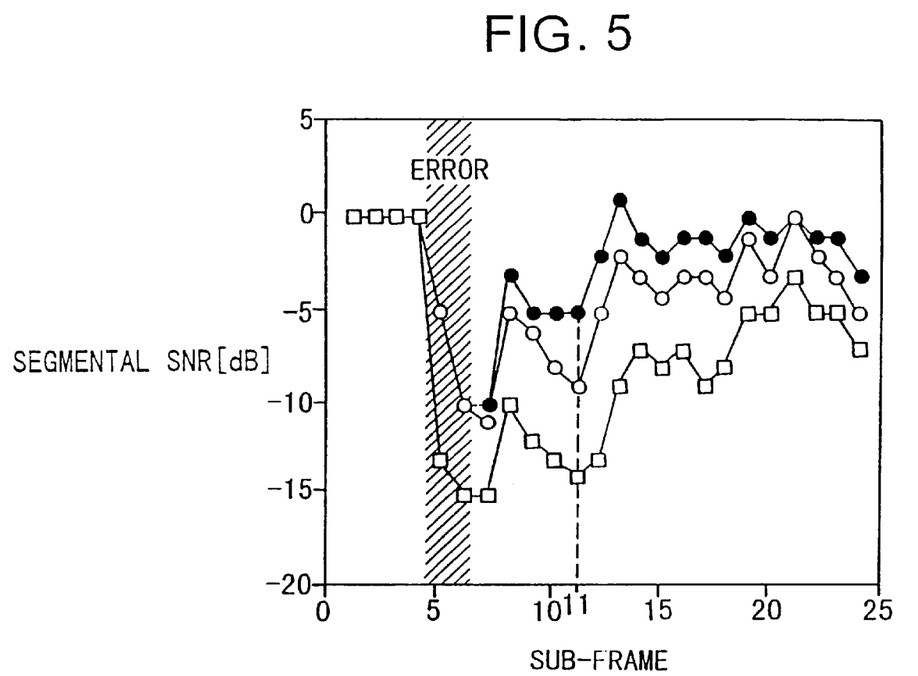
FIG. 5 is a view showing the result of measurement of segmental SNR in an experiment utilizing the speech decoder of FIG. 1.

An experiment was carried out, in which a speech decoder according to the present invention was applied to an adaptive codebook of ACELP and errors were added to the LAG as parameters of the adaptive codebook. In this experiment, the decoding process and the updating of the internal state were carried out on the basis of each sub-frame unit, and errors were added at the fifth and sixth sub-frames. Then, the segmental SNR was measured. Consequently, a result of measurement as shown in FIG. 5 was obtained. In FIG. 5, white squares indicate the segmental SNR when no interpolation is carried out at the time of code errors, whereas white circles indicate the segmental SNR when the interpolation routine is carried out at the time of code errors. On the other hand, black squares indicate the segmental SNR when the error recovery routine is carried out at the error recovery frame (seventh sub-frame) and the interpolation routine was carried out. That is, the result of measurement indicated by the black squares corresponds to the case in which the speech decoder according to this embodiment is applied.

For example, in the eleventh sub-frame, when the error recovery routine and the interpolation routine are carried out, the segmental SNR can be improved by 4dB compared with the case wherein the interpolation routine is carried out and by 9dB compared with the case where no interpolation is carried out. In this way, it was ascertained that the error recovery routine extensively improves the segmental SNR after the code errors occur.

4. Modified Embodiments

In the above embodiment, the estimated code sequence C'(t+1), . . . , C'(t+s−1) may be replaced not only by the LSP and LAG but also by other codes having a large aging correlation, or it may be calculated by other methods. Further, the estimation may be carried out not only by utilizing the code sequence C(t) immediately before the occurrence of errors but also by utilizing the previous correct code sequence C(t−1), C(t−2). . . . In that case, the error recovery routine part 140 recalculates the code sequence C"(t+1), . . . , C"(t+s−1) of the error section utilizing the correct code sequence C(t−1) C(t−2), . . . immediately before the occurrence of errors as the content of the input code storage unit 12', and a new correct code sequence C(t+s) generated from the input code sequence In(t+s), and outputs the result.

When the estimation is carried out utilizing both the correct code sequence before the occurrence of errors and the correct code sequence after the recovery from errors, the second estimated code sequence C"(t+1), C"(t+s−1) for updating the internal state information again may use only both the correct code sequence after the recovery from errors and the code sequence C(t) immediately before the occurrence of errors, or may use the more previous correct code sequence C(t−1), C(t−2), . . . .

The second estimated code sequence C"(t+1), . . . , C"(t+s−1) for updating the internal state information again may be estimated only from the correct code sequence after the recovery from errors. The correct code sequence after the recovery from errors may use only the code sequence C(t+s) immediately after the recovery from errors or may use the correct code sequence C(t+s), C(t+s+1), . . . .

The second estimated code sequence C"(t+1), . . . C"(t+s−1) is not necessarily required to be calculated over the entire time period when the errors occur. It may calculates only a part of the time period and updates the internal state based on the result of calculation.

In the systems in which some delay is allowed, it may be arranged such that the switch 4 is turned on at time t+s and the decoded speed is output.

As for the internal state, it is preferred that an adaptive codebook as a representative speech coding algorithm is used. However, the internal state is not necessarily limited to this.

We claim:

1. A speech decoder that receives from a speech encoder code sequences representative of speech data and decodes said code sequences to recreate said speech data, said speech decoder comprising:

(a) an error detecting unit for detecting whether a correct or incorrect code sequence is received;

(b) a decoding unit for decoding said code sequences in succession, using internal decoding information, wherein said decoding unit, each time decoding one code sequence, updates said internal decoding information based on decoding of said one code sequence for decoding of a next code sequence;

(c) a regular routine unit for supplying correct code sequences to said decoding unit for decoding to recreate said speech data;

(d) an error concealment unit responsive to receipt of an incorrect code sequence for constructing a code sequence of first estimation, using a prior correct code sequence, and supplying said code sequence of first estimation to said decoding unit for decoding to recreate said speech data; and (e) an error recovery unit responsive to receipt of one or more correct code sequences subsequent to receipt of one or more incorrect code sequences for constructing one or more code sequences of second estimation, using said one or more correct code sequences, and supplying said one or more code sequences of second estimation to said decoding unit for decoding, wherein said decoding unit, as decoding said one or more code sequences of second estimation, redoes the updating of said internal decoding information previously done based on decoding of one or more code sequences of first estimation constructed in response to receipt of said one or more incorrect code sequences in order to make said internal decoding information coincident with internal encoding information of said speech encoder.

2. A speech decoder according to claim 1, wherein said error recovery unit constructs said one or more code sequences of second estimation, using a correct code sequence received immediately subsequent to said one or more incorrect code sequences.

3. A speech decoder according to claim 1, wherein said error recovery unit constructs said one or more code sequences of second estimation, using one or more correct code sequences received prior to said one or more incorrect code sequences and one or more correct code sequences received subsequent to said one or more incorrect code sequences.

4. A speech decoder according to claim 3, wherein said error recovery unit constructs said one or more code sequences of second estimation, using two correct code sequences immediately succeeding and preceding said one or more incorrect code sequences.

5. A speech decoder according to claim 1, wherein said one or more code sequences of second estimation each correspond to one of said one or more incorrect code sequences.

6. A speech decoder according to claim 1, wherein said error concealment unit constructs said code sequence of first estimation by replacing time-correlated codes contained in said incorrect code sequence with corresponding codes contained in said prior correct code sequence.

7. A speech decoder that receives from a speech encoder code sequences representative of speech data and decodes said code sequences to recreate said speech data, said speech decoder comprising:

(a) an error detecting unit for detecting whether a correct or incorrect code sequence is received;

(b) a decoding unit for decoding said code sequences in succession, using internal decoding information, wherein said decoding unit, each time decoding one code sequence, updates said internal decoding information based on decoding of said one code sequence for decoding of a next code sequence;

(c) a regular routine unit for supplying correct code sequences to said decoding unit for decoding to recreate said speech data;

(d) an error concealment unit responsive to receipt of an incorrect code sequence for constructing a code sequence of first estimation, using a prior correct code sequence, and supplying said code sequence of first estimation to said decoding unit for decoding to recreate said speech data; and (e) an error recovery unit responsive to receipt of one or more correct code sequences subsequent to receipt of one or more incorrect code sequences for constructing one or more code sequences of second estimation, using said one or more correct code sequences received subsequent to said one or more incorrect code sequences and one or more correct code sequences received prior to said one or more incorrect code sequences, and supplying said one or more code sequences of second estimation to said decoding unit for decoding, wherein said decoding unit, as decoding said one or more code sequences of second estimation, redoes the updating of said internal decoding information previously done based on decoding of one or more code sequences of first estimation constructed in response to receipt of said one or more incorrect code sequences in order to make said internal decoding information coincident with internal encoding information of said speech encoder.

8. A speech decoder according to claim 7, wherein said error recovery unit constructs said one or more code sequences of second estimation, using two correct code sequences immediately succeeding and preceding said one or more incorrect code sequences.

9. A speech decoder according to claim 7, wherein said one or more code sequences of second estimation each correspond to one of said one or more incorrect code sequences.

10. A speech decoder according to claim 7, wherein said error concealment unit constructs said code sequence of first estimation by replacing time-correlated codes contained in said incorrect code sequence with corresponding codes contained in said prior correct code sequence.

11. A method of decoding code sequences representative of speech data received from a speech encoder to recreate said speech data, said method comprising the steps of:

(a) detecting whether a correct or incorrect code sequence is received;

(b) moving to and staying in a first mode when a correct code sequence is received, said first mode including the steps of
decoding said correct code sequence, using internal decoding information, to recreate said speech data, and updating said internal decoding information based on decoding of said correct code sequence for decoding of a next code sequence;

(c) moving to and staying in a second mode when an incorrect code sequence is received, said second mode including the steps of
constructing a code sequence of first estimation, using a prior correct code sequence,
decoding said code sequence of first estimation, using said internal decoding information, to recreate said speech data, and
updating said internal decoding information based on decoding of said code sequence of first estimation for decoding of a next code sequence; and (d) moving from said second mode to a third mode when one or more correct code sequences are received subsequent to receipt of one or more incorrect code sequences, said third mode including the steps of
constructing one or more code sequences of second estimation, using said one or more correct code sequence,
redoing, as decoding said one or more code sequences of second estimation, the updating of said internal decoding information previously done based on one or more code sequences of first estimation constructed in response to receipt of said one or more incorrect code sequences in order to make said internal decoding information coincident with internal encoding information of said speech encoder, and moving to said first mode for decoding of said subsequent correct code sequence to recreate said speech data.

12. A method according to claim 11, wherein said one or more code sequences of second estimation are constructed, using a correct code sequence received immediately subsequent to said one or more incorrect code sequences.

13. A method according to claim 11, wherein said one or more code sequences of second estimation are constructed, using one or more correct code sequences received prior to said one or more incorrect code sequences and one or more correct code sequences received subsequent to said one or more incorrect code sequences.

14. A method according to claim 13, wherein said one or more code sequences of second estimation are constructed, using two correct code sequences immediately succeeding and preceding said one or more incorrect code sequences.

15. A method according to claim 11, wherein said one or more code sequences of second estimation each correspond to one of said one or more incorrect code sequences.

16. A method according to claim 11, wherein said code sequence of first estimation is constructed by replacing time-correlated codes contained in said incorrect code sequence with corresponding codes contained in said prior correct code sequence.

17. A method of decoding code sequences representative of speech data received from a speech encoder to recreate said speech data, said method comprising the steps of:

(a) detecting whether a correct or incorrect code sequence is received;

(b) moving to and staying in a first mode when a correct code sequence is received, said first mode including the steps of decoding said correct code sequence, using internal decoding information, to recreate said speech data, and updating said internal decoding information based on decoding of said correct code sequence for decoding of a next code sequence;

(c) moving to and staying in a second mode when an incorrect code sequence is received, said second mode including the steps of constructing a code sequence of first estimation, using a prior correct code sequence, decoding said code sequence of first estimation, using said internal decoding information, to recreate said speech data, and updating said internal decoding information based on decoding of said code sequence of first estimation for decoding of a next code sequence; and (d) moving from said second mode to a third mode when one or more correct code sequences are received subsequent to receipt of one or more incorrect code sequences, said third mode including the steps of constructing one or more code sequences of second estimation, using said one or more correct code sequences received subsequent to said one or more incorrect code sequences and one or more correct code sequences received prior to said one or more incorrect code sequences, redoing, as decoding said one or more code sequences of second estimation, the updating of said internal decoding information previously done based on one or more code sequences of first estimation constructed in response to receipt of said one or more incorrect code sequences in order to make said internal decoding information coincident with internal encoding information of said speech encoder, and moving to said first mode for decoding of said subsequent correct code sequence to recreate said speech data.

18. A method according to claim 17, wherein said one or more code sequences of second estimation are constructed, using two correct code sequences immediately succeeding and preceding said one or more incorrect code sequences.

19. A method according to claim 17, wherein said one or more code sequences of second estimation each correspond to one of said one or more incorrect code sequences.

20. A method according to claim 17, wherein said code sequence of first estimation is constructed by replacing time-correlated codes contained in said incorrect code sequence with corresponding codes contained in said prior correct code sequence.

* * * * *